(12) United States Patent
Lenssen et al.

(10) Patent No.: US 6,501,678 B1
(45) Date of Patent: Dec. 31, 2002

(54) MAGNETIC SYSTEMS WITH IRREVERSIBLE CHARACTERISTICS AND A METHOD OF MANUFACTURING AND REPAIRING AND OPERATING SUCH SYSTEMS

(75) Inventors: Kars-Michiel Hubert Lenssen, Eindhoven (NL); Derk Jan Adelerhof, Eindhoven (NL); Gerardus Henricus Johannes Somers, Eindhoven (NL); Joannes Baptist Adrianus Dionisius Van Zon, Eindhoven (NL); Antonius Emilius Theodorus Kuiper, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/763,206

(22) PCT Filed: Jun. 16, 2000

(86) PCT No.: PCT/EP00/05605
§ 371 (c)(1),
(2), (4) Date: Feb. 16, 2001

(87) PCT Pub. No.: WO00/79298
PCT Pub. Date: Dec. 28, 2000

(30) Foreign Application Priority Data

Jun. 18, 1999 (EP) .............................................. 99201961
Mar. 15, 2000 (EP) .............................................. 00200937

(51) Int. Cl.$^7$ ............................................. G11C 11/00
(52) U.S. Cl. ......................... 365/173; 365/158; 324/252
(58) Field of Search ................................. 365/158, 171, 365/173, 225.5, 157, 159; 324/252; 338/32 R

(56) References Cited

U.S. PATENT DOCUMENTS

| | | | | |
|---|---|---|---|---|
| 5,477,482 A | * | 12/1995 | Prinz | 365/129 |
| 5,561,368 A | * | 10/1996 | Dovek et al. | 324/252 |
| 5,617,071 A | * | 4/1997 | Daughton | 338/32 R |
| 5,945,825 A | * | 8/1999 | Clemens | 324/252 |
| 6,100,686 A | * | 8/2000 | Van Delden et al. | 324/252 |
| 6,175,296 B1 | * | 1/2001 | Tokunaga et al. | 338/32 R |
| 6,178,111 B1 | * | 1/2001 | Sather et al. | 365/158 |
| 6,329,818 B1 | * | 12/2001 | Tokunaga et al. | 324/252 |

* cited by examiner

Primary Examiner—Hoai Ho
Assistant Examiner—Gene N. Auduong
(74) Attorney, Agent, or Firm—Steven R. Biren

(57) ABSTRACT

A novel magnetic data storage system and a sensing system of magnetic characteristics are disclosed; the systems have a magnetization direction that is irreversible in an external magnetic field. A method of manufacturing, a method of resetting or changing or repairing and a method of operating such systems are also disclosed. The systems can include a set of magnetic devices in a balancing configuration; essentially each of said devices comprises a structure of layers including at least a first ferromagnetic layer and a second ferromagnetic layer with at least a separation layer of a non-magnetic material there between, said structure having at least a magneto resistance effect. The magnetization direction of the first ferromagnetic layer of at least one of said devices is irreversible in an external magnetic field higher than about 35 kA/m.

10 Claims, 7 Drawing Sheets

MAGNETIC SYSTEMS WITH IRREVERSIBLE CHARACTERISTICS AND A METHOD OF MANUFACTURING AND REPAIRING AND OPERATING SUCH SYSTEMS

FIELD OF THE INVENTION

The present invention is related to the field of magnetic devices. More in particular, a magnetic data storage system and a sensing system of magnetic characteristics, the systems having a magnetization direction that is irreversible in an external magnetic field, are disclosed. A method of manufacturing, a method of resetting or changing or repairing and a method of operating such systems are also disclosed.

BACKGROUND OF THE INVENTION

Magnetic devices are known in the art. Spin-valve structures such as Giant Magneto Resistance (GMR) and Spin-tunnel Magneto Resistance (TMR) devices recently have been extensively studied and were subject of a vast number of disclosures. GMR- and TMR-devices comprise as a basic building stack two ferromagnetic layers separated by a separation layer of a non-magnetic material. This structure in the sequel is referred to as the basic GMR- or TMR-stack of the magnetic device, or is referred to as the GMR- or TMR-structure. Such structure has magneto resistance characteristics and shows the GMR- or TMR-effect. The separation layer is a non-ferromagnetic metallic layer for GMR-devices, and is a non-metallic, preferably insulating, layer for TMR-devices. Over the separation layer, there is a magnetic coupling between the two ferromagnetic layers. The insulating layer in the TMR-devices allows for a significant probability for quantum mechanical tunneling of electrons between the two ferromagnetic layers. Of the two ferromagnetic layers, one is a so-called free layer, and one is a so-called pinned or hard layer. The free layer is a layer whose magnetization direction can be changed by applied magnetic fields with a strength lower, preferably substantially lower, than the strength of the field required for changing the magnetization direction of the pinned layer. Thus the pinned layer has a preferred, rather fixed magnetization direction, whereas the magnetization direction of the free layer can be changed quite easily under an external applied field.

The hard layer can consist of a hard magnetic material or of a relatively soft magnetic material pinned by exchanged biasing to an Anti-Ferromagnetic (AF) layer, or it can consist of an Artificial-Anti-Ferromagnet (AAF) consisting of two or more magnetic layers coupled in an anti-parallel direction by an appropriate intermediate non-magnetic coupling layer. The AAF can be biased by an AF layer to make it even more rigid and to define a single-valued magnetization direction of the AAF.

A change of the magnetization of the free layer changes the resistance of the TMR- or GMR-device. This results in the so-called magneto resistance effect or GMR/TMR effect of these devices. The electrical resistance of the TMR- or GMR-device changes in a predictable manner in response to a varying magnetic field, making the devices suitable for use as magnetic-electrical transducers in a sensing system of a magnetic field. The characteristics of these magnetic devices or systems can be exploited in different ways. For example a spin valve read-out element utilizing the GMR-effect can be used for advanced hard disk thin film read heads. Also stand-alone magnetic memory systems (MRAMs) or non-volatile embedded memory systems can be made based on the GMR- or TMR-devices.

A further application is a sensor device or system for magnetic characteristics. Such sensing systems are used for example in anti-lock braking (ABS) systems or other automotive applications.

It is often required in a number of applications to clearly distinguish between the response of the sensor system (resistance changes) due to (varying) magnetic field and the response of the sensing system (resistance changes) due to environmental factors such as temperature variations. One approach in solving this problem consists in connecting a number of GMR- or TMR-devices in a Wheatstone bridge arrangement. If a pair of GMR or TMR devices can be magnetically biased in such a manner as to have opposite responses (in the sense of opposite polarity) to a given magnetic field but not to other environmental factors, then subtractive comparison of the electrical resistances of the two GMR or TMR devices will cause cancellation of any unwanted response to spurious environmental factors, while exposing any response to magnetic field.

Magnetic field sensing system employing a Wheatstone bridge in this manner are known from the prior art. However, among the sensing system thus known, there are various different approaches when it comes to magnetically biasing the magneto-resistive devices.

For example: in Japanese patent application (Kokai) No. 61-711 (A), each of the resistive devices in the Wheatstone bridge is magnetically biased in a given direction using an appropriately poled permanent magnet positioned in the vicinity of that device; on the other hand, in an article in Philips Electronic Components and Materials Technical Publication 268 (1988) entitled "The magnetoresistive sensor" the individual resistive devices are biased using a so-called "barber pole" (a term generally known and understood in the art, and thus receiving no further elucidation here).

The use of biasing on the basis of permanent magnets as in case (a) above is highly unsatisfactory: not only is very careful tuning of the strength and position of the permanent magnets required, but the permanent magnets are themselves unacceptably sensitive to temperature variations. In addition, the use of permanent magnets necessarily makes any such biased magnetic field sensor bulky, and sets a limit on the attainable degree of miniaturization. On the other hand, while the biasing method in case (b) may be suitable for resistive devices demonstrating the so-called Anisotropic Magneto-Resistive (AMR) effect, it cannot be employed in conjunction with resistive devices demonstrating the GMR or TMR effect.

In the prior art document J. Daughton, J. Brown, E. Chen, R. Beech, A. Pohm and W. Kude, "Magnetic field sensors using GMR multilayer", IEEE Trans. Magn. 30, 4608 (1994), two (of the four) bridge elements are magnetically shielded, the shields may be used as flux concentrators for the two sensitive device.

Freitas in "Giant magnetoresistive sensors for rotational speed control", J. Appl. Phys. 85, 5459 (1999) suggests that two (of the four) bridge devices are "inactivated" by depositing them on a roughened part of the substrate.

Another approach devolves on integrating an isolated conductor below or over the sensor elements (consisting of exchange-biased spin valves) to induce a magnetic field that "sets" the exchange-biasing direction of the device in opposite directions, while the devices are heated above the blocking temperature of the exchange-biasing material R. Coehoorn and G. F. A van de Walle, "A magnetic field sensor, an instrument comprising such a sensor and a method of manufacturing such a sensor", patent application EP 95913296.0, now granted, and J. K. Spong, V. S. Speriosu, R. E. Fontana Jr., M. M. Dovek and T. L. Hylton, "Giant and magnetoresistive spin valve bridge sensor", IEEE Trans. Magn.32, 366 (1996); M. M. Dovek, R. E. Fontana Jr., V. S. Speriosu and J. K. Spong, "Bridge circuit magnetic field sensor having spin valve magnetoresistive elements formed on common substrate", U.S. Pat. No. 5,561,368. A comparable method with an integrated conductor has been proposed for elements based on an Artificial Antiferromagnet (AAF) by W. Schelter and H. van den Berg in "Magnetfeldsensor mit einer Brückenschaltung von magnetoresistiven Brückenelementen", DE 19520206 (01.06.95).

In the patent application WO 9638738-A1 "Magnetoresistive thin-film elements-uses adjustment current at high temp. to regulate magnetization distribution of bias layer of sensor elements arranged in bridge circuit, and includes cooling body" (Ger) it is suggested that in the factory the magnetizations are set in opposite directions in different branches of the bridges by exposing a wafer with sensor structures to an external magnetic field that is induced by a kind of "stamp" comprising a pattern of current carrying conductors which is brought in the vicinity of the wafer.

These prior art solutions are rather complicated and require quite some effort in practice. Moreover, the possibilities disclosed in J. Daughton, J. Brown, E. Chen, R. Beech, A. Pohln and W. Kude, "Magnetic field sensors using GMR multilayer", IEEE Trans. Magn. 30, 4608 (1994), and Freitas "Giant magnetoresistive sensors for rotational speed control", J. Appl. Phys. 85, 5459 (1999) only allow the realization of a half-bridge and therefore loose half of the possible output signal or response. The magnetic fields that can be realized with the options suggested by R. Coehoorn and G. F. A van de Walle, "A magnetic field sensor, an instrument comprising such a sensor and a method of manufacturing such a sensor" and J. K. Spong, V. S. Speriosu, R. E. Fontana Jr., M. M. Dovek and T. L. Hylton, "Giant and magnetoresistive spin valve bridge sensor", IEEE Trans. Magn.32, 366 (1996); M. M. Dovek, R. E. Fontana Jr., V. S. Speriosu and J. K. Spong, "Bridge circuit magnetic field sensor having spin valve magnetoresistive elements formed on common substrate", U.S. Pat. No. 5,561,368 (04.11.94) and W. Schelter and H. van den Berg in "Magnetfeldsensor mit einer Brückenschaltung von magnetoresistiven Brückenelementen", DE 19520206 are very limited in strength, because the currents have to be relatively small in the (necessarily narrow and thin) conductors. Further, the options disclosed in J. Daughton, J. Brown, E. Chen, R. Beech, A. Pohm and W. Kude, "Magnetic field sensors using GMR multilayer", IEEE Trans. Magn. 30, 4608 (1994), R. Coehoorn and G. F. A van de Walle, "A magnetic field sensor, an instrument comprising such a sensor and a method of manufacturing such a sensor" and J. K. Spong, V. S. Speriosu, R. E. Fontana Jr., M. M. Dovek and T. L. Hylton, "Giant and magnetoresistive spin valve bridge sensor", IEEE Trans. Magn.32, 366 (1996); M. M. Dovek, R. E. Fontana Jr., V. S. Speriosu and J. K. Spong, "Bridge circuit magnetic field sensor having spin valve magnetoresistive elements formed on common substrate", U.S. Pat. No. 5,561,368 (04.11.94) require several extra processing steps (both for patterning and isolation of the conductors or shields), which makes the sensors more expensive and reduces the fabrication yield. If the method suggested in the patent application WO 9638738-A1 "Magnetization device for magnetoresistive thin-film elements-uses adjustment current at high temp. to regulate magnetization distribution of bias layer of sensor elements arranged in bridge circuit, and includes cooling body is used, the sensor can be destroyed if exposed to magnetic field of the same strength (or larger) as the field used during setting the magnetization directions.

In particular for automotive applications, but also for read heads, the robustness of the sensing system becomes more and more important. This trend makes setting of magnetization directions after deposition of the elements more and more difficult. In sensing systems that have to operate in relatively large magnetic fields, as required in for instance automotive applications, the hard magnetic layer should be as hard as possible. This makes a definition of the hard magnetization direction after deposition less attractive since it puts an upper limit to the "hardness" of the magnetic reference layer, otherwise the magnetization direction of this hard layer cannot be set. For example, the sensing systems as disclosed in WO 96/38740 and WO 96/38738 can not be used in magnetic fields stronger than 15 kA/m (18 mT) since this may change the direction of the hard magnetic reference direction. For automotive applications, typically magnetic bias fields of 5–100 mT are used.

In Wheatstone bridge configurations, it is needed that the four devices that make the Wheatstone bridge are identical and therefore preferably are made under a uniform manufacturing condition. This uniform manufacturing condition may be a uniform deposition condition for all devices of the sensing system but at the end of the manufacturing cycle two devices with opposite exchange biasing directions are needed.

SUMMARY OF THE INVENTION

It is an aim of the present invention to disclose a sensing system for a magnetic characteristic and a magnetic data storage system that are robust and that have at least one magnetic characteristic that is irreversible in an external magnetic field. It is another aim of the present invention to disclose a sensing system for a magnetic characteristic that can combine different magnetization directions within a limited space such as a single substrate or a single chip and therefore allows for a further miniaturization of the sensing systems. Also a data storage system is disclosed that can combine different magnetization directions within a limited space such as a single substrate or a single chip and therefore allows for a further miniaturization of the sensing systems. It is a further aim of the present invention to disclose a method of manufacturing a sensing system and/or a magnetic data storage system of which the magnetization direction of at least part of at least one of the devices can be set during manufacturing of the system, and for which the processing is simple and requires only a limited number or no extra processing steps. It is yet another aim of the present invention to disclose a method of manufacturing a sensing system of magnetic characteristics and/or magnetic data storage system that can combine different magnetization directions within a limited space such as a single substrate or a single chip and therefore does not pose strict limits on miniaturization of the system.

Several aspects of the invention are summarized herebelow. The different aspects and embodiments of the invention that are explained in this section and throughout the whole specification can be combined as and to the extent the person of skill in the art is able to appreciate. A number of terms that is used in this summary and throughout the specification is explained at the end of this section.

In a first aspect of the present invention a sensing system of a magnetic characteristic is disclosed. Said system includes a set of magnetic devices in a balancing configuration and essentially each of said devices comprises a structure of layers including at least a first ferromagnetic layer and a second ferromagnetic layer with at least a separation layer of a non-magnetic material therebetween, said structure having at least a magneto resistance effect, and wherein the magnetization direction of the first ferromagnetic layer of at least one of said devices is irreversible in an external magnetic field with a value higher than about 35 kA/m. The value of the external magnetic field can also be higher than about 40 or 50 or 60 kA/m. The external magnetic field can also have value in a range of about 35 kA/m to about 2 MA/m or even 200 MA/m. Preferably the first ferromagnetic layer is the pinned or hard ferromagnetic layer.

The ferromagnetic layers of the devices of the sensing system of the invention may be composed of several layers and other intermediate layers may be present in the stack of layers. In an embodiment of the invention, at least one of the devices of the sensing system includes an Artificial Anti-Ferromagnet (AAF) structure. An AAF is a magnetic multilayer structure that includes alternating ferromagnetic and non-magnetic layers which have an exchange coupling that results in an antiparallel orientation of the ferromagnetic layers in the absence of an external magnetic field. Such result can be achieved through appropriately choosing the materials and layer thicknesses of the AAF multilayer stack. Each of the ferromagnetic layers of the AAF can consist of subsystems of other ferromagnetic materials. The sensing system can also include an exchange-biased AAF magnetic multilayer structure. The exchange-biased AAF can include an exchange biasing layer of IrMn, FeMn, NiMn, PtMn or NiO type material, said exchange biasing layer being adjacent to, and in contact with, the AAF-structure.

In another embodiment of this first aspect of the invention, the sensing system can comprise at least four (or even at least two) magnetic devices being positioned in a two by two grouped, preferably at least pair-like, configuration with a contact area between the groups (pairs) and with the magnetization direction of the first ferromagnetic layer being substantially opposite for the devices of different groups (pairs) and being substantially identical for the devices of the same group (pair). Preferably the first ferromagnetic layer is the pinned or hard ferromagnetic layer.

In yet another embodiment of this first aspect of the invention, the sensing system can have at least four (or even at least two) magnetic devices being positioned in a grouped, preferably at least two by two pair-like configuration, with a first group (pair) of devices with substantially the same magnetization direction of the first ferromagnetic layer of the devices under an angle of about 90 degrees with a second group (pair) of devices, the second group (pair) of devices having the first ferromagnetic layer with substantially the same magnetization direction but under an angle of about 90 degrees with respect to the magnetization direction of the first ferromagnetic layer of the first group (pair) of devices, and with a contact area. Preferably the first ferromagnetic layer is the pinned or hard ferromagnetic layer.

In a second aspect of the present invention, a method of manufacturing a sensing system of a magnetic characteristic is disclosed. The system includes a set of magnetic devices in a balancing configuration and essentially each of said devices comprises a structure of layers including at least a first ferromagnetic layer and a second ferromagnetic layer with at least a separation layer of a non-magnetic material therebetween, said structure having at least a magneto resistance effect. The method comprises the step of heating part of the system including at least one of the devices of said set while applying an external magnetic field over at least part of said system, the part including said at least one device. The part of the system that is heated can partly or completely coincide with the part of the system that is exposed to said external magnetic field. Thus localized heating of the system in an external magnetic field is achieved. Preferably the external magnetic field is homogeneous over said part. The heating can be achieved by applying a current pulse on or through the device. The heating can also be achieved by applying a laser pulse or a pulse from an electron beam or ion beam on or through the device. Preferably at least one of the devices is heated to a temperature in the range of about 50 to about 800° C., preferably in the range of about 300 or 400 or about 600° C., while said external magnetic field has a value in the range of about 35 kA/m or 40 kA/m or 50 kA/m to 200 MA/m.

Localized heating of only one of the devices of the system in an external magnetic field can be achieved or all of the devices of said set can be heated to the same temperature or at least two of the devices of the set can be heated to a different temperature value. The external magnetic field directions can also be alternating over at least part of said system. By applying this method of the invention, sensing systems with multiple biasing directions of the devices in the system can be achieved. The devices have a thermally and magnetically robust material structure that is suited in for example automotive applications.

The method can be such that after the execution of the steps, the first ferromagnetic layer of said at least one device has a magnetization direction that is correlated to the direction of said external magnetic field, and preferably being irreversible in an external magnetic field higher than about 35 kA/m.

In a third aspect of the present invention, a method of manufacturing a sensing system of a magnetic characteristic is disclosed. The system includes a set of magnetic devices in a balancing configuration and essentially each of the devices comprises a structure of layers including at least a first ferromagnetic layer and a second ferromagnetic layer with at least a separation layer of a non-magnetic material therebetween, said structure having at least a magneto resistance effect. The method comprises the steps of depositing said structure of layers of at least one of said devices on a substrate while applying at least during a time part of the deposition step an external magnetic field over at least part of said substrate. Preferably, the external magnetic field has at least one characteristic that is position dependent over said substrate. Such characteristic can include the magnitude and/or the magnetization direction of said magnetic field.

During deposition, the substrate can be held in a deposition holder, said holder containing magnetic elements for applying said external magnetic field. After the execution of the method, the first ferromagnetic layer of said at least one device has a magnetization direction that is correlated to the direction of said external magnetic field and the magnetization direction of this first ferromagnetic layer is irreversible in an external magnetic field higher than about 35 kA/m. While executing the method according to the second aspect of the invention, the substrate may also be heated.

In a fourth aspect of the present invention, a method of manufacturing a sensing system of a magnetic characteristic is disclosed. The system includes a set of magnetic devices in a balancing configuration and essentially each of said devices comprising a structure of layers including at least a first ferromagnetic layer and a second ferromagnetic layer with at least a separation layer of a non-magnetic material therebetween, said first structure having at least a magneto resistance effect. The method comprises the steps of depositing a first ferromagnetic layer of at least a first of the devices of said set while applying a magnetic field to pin the magnetization direction in the first ferromagnetic layer in a first direction (the first deposition step) ; and thereafter depositing a first ferromagnetic layer of another of the devices of said set while applying a magnetic field to pin the magnetization direction in this first ferromagnetic layer in a second direction different from, preferably opposite to, the magnetization direction in the first ferromagnetic layer of the first device (the second deposition step). While executing the method according to the fourth aspect of the present invention, magnetic fields of opposing direction can be applied during the first and the second deposition step. The set of magnetic devices in a balancing configuration can include two full Wheatstone bridge arrangements, the magnetization directions in corresponding devices of the Wheatstone bridges being pinned at different angles.

In a fifth aspect of the present invention, a deposition holder for a substrate for depositing a structure of layers on said substrate is disclosed, said holder containing magnetic elements for applying an external magnetic field over at least part of said substrate, said external magnetic field having at least one magnetic characteristic that is position dependent over said substrate. Said characteristic can include the magnitude and/or the magnetization direction of said magnetic field. The deposition holder can further comprise at least one heating element for heating at least part of said substrate while applying said external magnetic field over said substrate. The deposition holder can also comprise magnetic elements for applying said external magnetic field.

In a sixth aspect of the present invention, a method of manufacturing a sensing system of a magnetic characteristic is disclosed. The system includes a set of magnetic devices in a balancing configuration and essentially each of said devices comprises a structure of layers including at least a first ferromagnetic layer and a second ferromagnetic layer with at least a separation layer of a non-magnetic material therebetween, said structure having at least a magneto resistance effect. The method comprises the step of depositing a first ferromagnetic layer of said set of devices, said first ferromagnetic layer being part of an AAF-structure, thereafter orienting said first ferromagnetic layer of said set of devices, and thereafter depositing the other layers of the AAF-structure and said second ferromagnetic layer and said separation layer of a non-magnetic material. The step of orienting the first ferromagnetic layer for example can be done by heating the set of devices in a spatially varying magnetic field.

In a seventh aspect of the present invention, a method of operating a magnetic system is disclosed, said system including a set of magnetic devices in a balancing configuration and essentially each of said devices comprising a structure of layers including at least a first ferromagnetic layer and a second ferromagnetic layer with at least a separation layer of a non-magnetic material therebetween, said first structure having at least a magneto resistance effect, the method comprising the step of alternating at least one of the magnetic characteristics of at least one of the devices of said set by heating said at least one device of said set while applying an external magnetic field over at least part of said system, the part including said at least one device. Preferably the system is a sensing system of a magnetic characteristic and includes a set of magnetic devices in a balancing configuration. The system may also be a read head or a data storage system such as a MRAM memory.

In an eighth aspect of the present invention, a method of resetting or repairing or changing a magnetic system is disclosed, said system including a set of magnetic devices and essentially each of said devices comprising a structure of layers including at least a first ferromagnetic layer and a second ferromagnetic layer with at least a separation layer of a non-magnetic material therebetween, said first structure having at least a magneto resistance effect, the method comprising the step of alternating at least one of the magnetic characteristics of at least one of the devices of said set by heating said at least one device of said set while applying an external magnetic field over at least part of said system, the part including said at least one device. Preferably the system is a sensing system of a magnetic characteristic and includes a set of magnetic devices in a balancing configuration. The system may also be a read head or a data storage system such as a MRAM memory.

In a ninth aspect of the present invention, a data storage system is disclosed that comprises one or more magnetic devices in a cell configuration and essentially each device comprising a structure of layers including at least a first ferromagnetic layer and a second ferromagnetic layer with at least a separation layer of a non-magnetic material therebetween, said first structure having at least a magneto resistance effect, and wherein the magnetization direction of the first ferromagnetic layer of at least one of said devices is irreversible in an external magnetic field higher than about 35 kA/m. The external magnetic field can also be higher than about 40 or 50 or 60 kA/m. The external magnetic field can also be in range of about 35 kA/m to about 200 MA/m.

The sensing system of the invention can be a magnetic sensor device or a magnetic read-head such as a GMR thin film head for hard disks or any such system including a magnetic device and signal processing electronics for processing the signal of the magnetic characteristic or a measure or derivate thereof. The devices of the sensing system and the data storage system of the invention can be made in a multilayer configuration building further on the basic GMR- or TMR-stack of the device. Therefore at least part of the system is manufacturable without significantly changing a standard production process to thereby make at least part of the system at a low cost. It is possible in an embodiment of the invention to integrate the whole sensing system and/or the data storage system of the invention on an Alsimag (a mixture of oxides) slider or on one semiconductor (silicon) chip with the multilayer configuration being grown or deposited on the chip. The multilayer configuration can be grown or deposited on the chip in the front-end or in the back-end of the process for making the chip. In the back-end process a part of the chip is planarized and the multilayer configuration is deposited or grown thereon. Appropriate connections by bonding or via structures are made in order to transfer the signals of the multilayer configuration to the part of the chip containing the signal processing logic. In the front-end process, the multilayer configuration is directly integrated on the semiconductor (silicon). The sensing system of the invention can also be an integrated circuit with a memory functionality and an integrated sensing system or an ASIC with an embedded non-volatile magnetic memory element and a sensing system or a chipcard with a sensing system or any such sensing system. The set of structures of the sensing system of the invention can be made in a multilayer configuration building further on the basic GMRor TMR-stack of the system. The layers of the devices of the systems of the invention can be deposited by Molecular Beam Epitaxy or MOCVD or sputter deposition or any such technique known to the person of skill in the art.

It is also possible to apply part of, or the whole of the teaching of the invention, to a single magnetic device or a set of magnetic devices that is not in a balancing configuration. Thus the second aspect of the invention for example can be described as a method of manufacturing magnetic device, and the device comprising a structure of layers that includes at least a first ferromagnetic layer and a second ferromagnetic layer with at least a separation layer of a non-magnetic material therebetween, said structure having at least a magneto resistance effect. The method comprises the step of heating said device while applying an external magnetic field over said device. The heating can be achieved by applying a current pulse on or through the device. Preferably, the device or at least one of the devices of the set is heated to a temperature in the range of 50 to 800° C., preferably in the range of 100 to about 300 or 400 or 600° C. while said external magnetic field can have a value in the range of about 35 kA/m or 40 kA/m or 50 kA/m to 200 MA/m.

A number of terms that is introduced hereabove and that is used in the sequel, can be described as follows, completing the understanding by the person of skill in the art of these terms.

The term that the magnetization direction of a magnetic device is irreversible in an external magnetic field means that the magnetization direction may be changed under the influence of an external field, but once the external field is switched off, the magnetization direction is taking substantially its original position from before the external field was applied. The magnetization direction may also remain substantially unchanged while exposed to the external field. Thus the possible change of the magnetization direction is reversible. This irreversible characteristic is visible while evaluating the device at room temperature and for evaluation times that are of the order of one minute or some minutes.

A set of magnetic devices that is in a balancing configuration means that the configuration is such that in the response of the system that is made out of the devices, one can clearly distinguish between the response or resistance changes due to (varying) magnetic field and the sensor response or resistance changes due to environmental factors such as temperature variations. One approach in configuring such balancing configuration consists in connecting a number of GMR- or TMR-devices in a Wheatstone-bridge configuration.

BRIEF DESCRIPTION OF THE DRAWINGS

FIG. 1 shows how a magnetic sensing system in a Wheatstone bridge configuration according to a best mode embodiment of the invention can be achieved.

DETAILED DESCRIPTION OF THE INVENTION

For the purpose of teaching of the invention, preferred embodiments of the methods and of manufacturing systems of the invention are described in the sequel. In particular, embodiments of the invention of devices with a magnetic multilayer configuration based on a basic GMR- or TMR-stack are disclosed. These multilayer configurations can be integrated in the systems of the invention according to techniques known to the person of skill in the art. It is for example possible in an embodiment of the invention to integrate the whole sensing or data storage system of the invention on one semiconductor (silicon) chip with the multilayer configuration being grown or deposited on the chip. The multilayer configuration can be grown or deposited on the chip in the front-end or in the back-end of the process for making the chip. In the back-end process a part of the chip is planarized and the multilayer configuration is deposited or grown thereon. Appropriate connections by bonding or via structures are made in order to transfer the signals of the multilayer configuration to the part of the chip containing the signal processing logic. It will be apparent to the person skilled in the art that other alternative and equivalent embodiments of the invention can be conceived and reduced to practice without departing form the true spirit of the invention, the scope of the invention being limited only by the appended claims.

A system of the invention can be manufactured according to a method of manufacturing of the second aspect of the invention. In the second aspect of the present invention, a method of manufacturing a sensing system of a magnetic characteristic is disclosed. The system includes a set of magnetic devices in a balancing configuration and essentially each of said devices comprises a structure of layers including at least a first ferromagnetic layer and a second ferromagnetic layer with at least a separation layer of a non-magnetic material therebetween, said structure having at least a magneto resistance effect. The method comprises the step of heating at least one of the devices of said set while applying an external magnetic field over at least part of said system, the part including said at least one device. Thus localized heating of the system in an external magnetic field is achieved. The heating can be achieved by applying a current pulse on or through the device. Preferably at least one of the devices is heated to a temperature in the range of 50 to 800° C., preferably in the range of 100 to about 300 or 400 or 600° C. while said external magnetic field has a value in the range of about 35 kA/m or 40 kA/m or 50 kA/m to 200 MA/m. In the embodiment that is disclosed in the sequel, after the execution of the steps, the first ferromagnetic layer of said at least one device has a magnetization direction that is correlated to the direction of said external magnetic field, and is irreversible in an external magnetic field higher than about 50 kA/m.

Figures 1A, 1B:
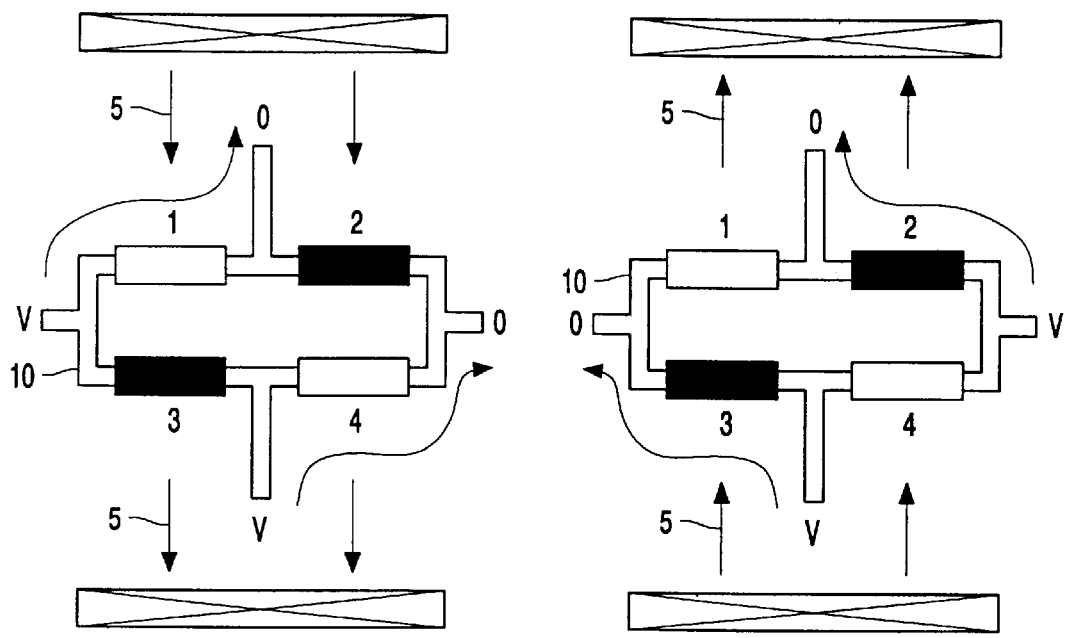
FIG. 1a and FIG. 1b show how the subsequent steps of orienting the devices 1 and 4 of the Wheatstone bridge and subsequently oppositely orienting the devices 2 and 3 can be achieved.

FIG. 1 shows how a magnetic sensing system in a Wheatstone bridge configuration according to a best mode embodiment of the invention can be achieved. The whole sensing system (10) comprising four magnetic devices (1-4) in a Wheatstone bridge configuration is brought in an external magnetic field (indicated by the vertical arrows (5)) and is electrically connected as indicated in FIG. 1a. The curved arrows on the figure indicate where the current pulses to achieve local heating of the devices will flow. An external field with a magnitude of about 200 kA/m is applied. The magnetic devices consist of a multilayer configuration that is made by sputter deposition. The multilayer configuration is deposited on a substrate of silicon and comprises subsequently:

- a buffer layer to induce the right material structure ((111) texture, in this case) in the multilayer; in this case the buffer layer is a stack of 3.5 nm Ta/2.0 nm $Ni_{80}Fe_{20}$;
- a first structure containing:
    - a layer structure consisting of an exchange-biased AAF, in this case 10.0 nm $Ir_{19}Mn_{81}$/4.5 nm $Co_{90}Fe_{10}$/0.8 nm Ru/4.0 nm $Co_{90}Fe_{10}$; the CoFe/Ru/CoFe stack is used as the first ferromagnetic layer (the pinned layer);
    - $Ir_{19}Mn_{81}$ (the exchange biasing layer) has been chosen as the exchange biasing material because of its high blocking temperature (around 560 K) for a good temperature stability the use of an AAF as pinned layer provides an excellent magnetic stability because of its very small nett magnetization, resulting in a great rigidity;
    - a separation layer of 3.0 nm Cu.
    - a free layer (the second ferromagnetic layer) of 0.8 nm $Co_{90}Fe_{10}$/3.5 nm $Ni_{80}Fe_{20}$/0.8 nm $Co_{90}Fe_{10}$ (the thin $Co_{90}Fe_{10}$ layers enhance the GMR ratio and limit interlayer diffusion, thereby improving the thermal stability); and the multilayer configuration further comprises:
- a high-resistive metallic layer of 2.5 nm Ta;
- a second structure comprising
    - a second pinned layer consisting of 4.0 nm $Co_{90}Fe_{10}$ exchange-biased with 10.0 nm $Ir_{19}Mn_{81}$;
- and finally
- a cap layer of 10.0 nm Ta for protection.

The current pulses to achieve local heating of the devices preferably are such that the resulting heat dissipation heats the device above the blocking temperature. Only this part of the sensing system which is heated above the blocking temperature will permanently attain the direction of the external magnetic field. If all bridge devices are originally oriented in the opposite direction (during deposition), this single setting step may be sufficient to realize a full-bridge configuration. If desired, however, the heating procedure can be repeated. This setting procedure can be repeated with different field directions as often as desired. This enables, for example, in an elegant way to make two Wheatstone bridges which are mutually rotated over 90° on a single substrate; this is desired for a GMR angle sensor with a 360° range.

Figure 2:
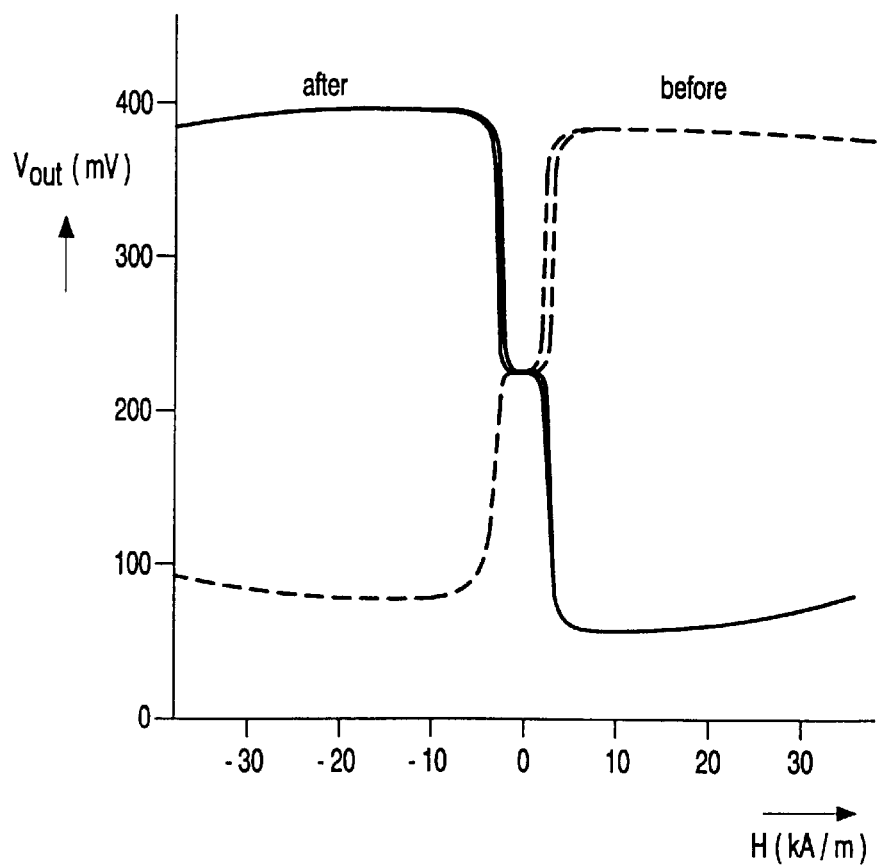
FIG. 2 shows measurements on a sensing system with magnetic devices that have opposite exchange-biasing directions and that are manufactured on the same substrate using the method of the invention as shown in FIG. 1. The measurements show the feasibility of the invention: the reversal of 2 times 2 GMR-devices in a full-bridge configuration is shown.

FIG. 2 shows measurements on a sensing system with magnetic devices that have opposite exchange-biasing directions and that are manufactured on the same substrate using this method. The dashed lines show the voltage output of a GMR Wheatstone bridge prior to the application of the method. The solid line shows the output after both pairs of GMR devices have been reversed by the method of this aspect of the invention. In this case a field of 200 kA/m and a heating current of several tens of mA is used. This demonstration also proves that it is possible to reorient locally, i.e. reorienting one element without reorienting a neighboring element. The advantages of applying the method of this aspect of the invention include:

- Enabling the realization of GMR or TMR devices comprising multiple exchange-biasing directions with only a single deposition step;
- Applicable for materials with robust exchange-biasing characteristics;
- Full Wheatstone-bridge configuration are possible;
- No integrated conductors for setting the magnetization directions (requiring several extra processing steps) are needed, thus a more simple processing is achieved.
- This method poses no strict limit to the smallest dimensions in the structure of the sensing system;
- Elements belonging to different bridge branches can be distributed alternatingly over the system;
- This method can easily be combined with a testing step in the manufacturing process;
- Provides a method to reset or repair magnetization directions in sensors, read elements and MRAMs after production;
- The method can be used even in finished (packaged) systems or devices.

According to a fourth aspect of the method in accordance with the invention, in a first deposition step a first ferromagnetic layer of one of the two opposite devices, of the sensing system is deposited, during which deposition in a magnetic field is applied to pin the magnetization direction in the first ferromagnetic layer in a first direction, after which in a second deposition step a second ferromagnetic layer of the other of the two said devices is deposited, during which deposition a magnetic field is applied to pin the magnetization direction in the second ferromagnetic layer in a second direction different from, preferably opposite to the magnetization direction in the first ferromagnetic layer.

In an embodiment of the invention the at least two pinned ferromagnetic layer are fabricated in at least 2 separate deposition steps, and during the deposition steps a magnetic field is generated by which opposite magnetic directions are imparted to the said pinned ferromagnetic layers. Preferably this is achieved by using magnetic fields of opposing direction during the first and second deposition step. Compared to methods in which magnetic fields are used with the same direction but in which the position of the device is changed such methods are simpler.

Preferably the magnetic field that is applied during the second deposition has a direction different from, preferably opposite from the direction of the field applied during the first deposition, while the position of the device during deposition is the same. Alternatively, but less favored, the magnetic field applied during deposition is the same, but the position of the device is changed between depositions to effect the same result. Although the method is applicable for manufacturing a sensing system having for example a half-Wheatstone bridge arrangement it is of importance also for a system having four bridge devices in a Wheatstone bridge arrangement.

Figure 3:
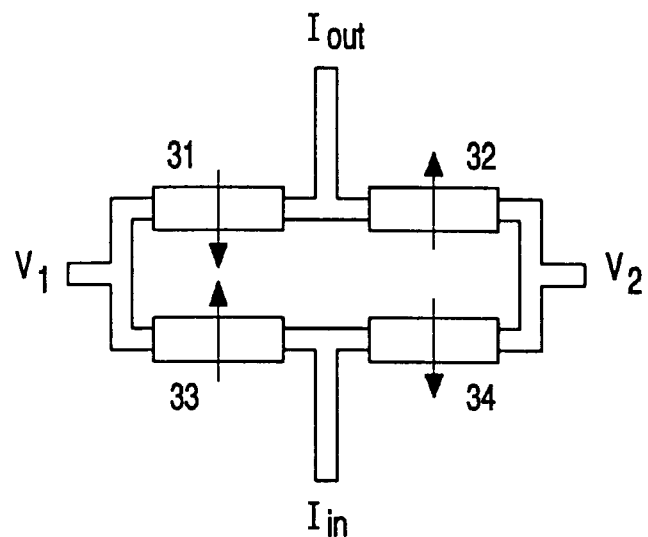
FIG. 3 shows schematically and in top view part of a device made in accordance with a method of the invention.

FIG. 3 shows schematically a top view of a device made in accordance with the method of the fourth aspect of the invention.

The embodiment shown in FIG. 3 comprises four bridges devices 31, 32, 33 and 34 in a Wheatstone bridge arrangement. Each of these devices comprises a free ferromagnetic layer and a pinned ferromagnetic layer separated by a separation layer. The magnetic direction in each of the pinned layers of the respective elements is in FIG. 1 indicated by an arrow. Adjacent elements (within the Wheatstone bridge arrangement) have opposite magnetic directions for pinned layers.

Figure 4:
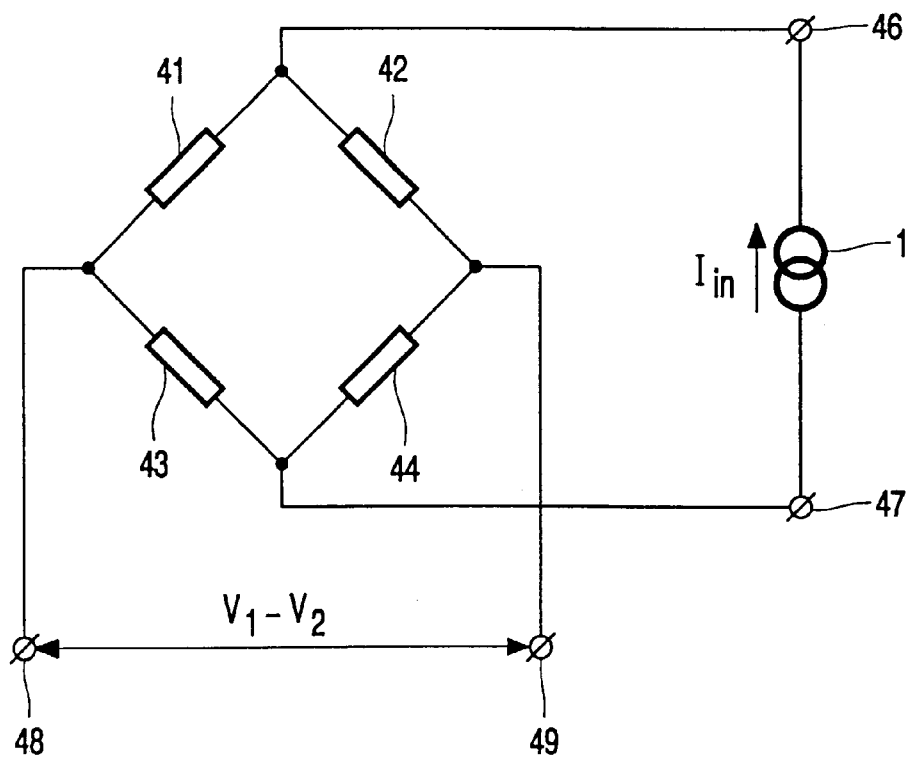
FIG. 4 shows a Wheatstone bridge arrangement having a magnetic device in accordance with the invention.
Figure 5:
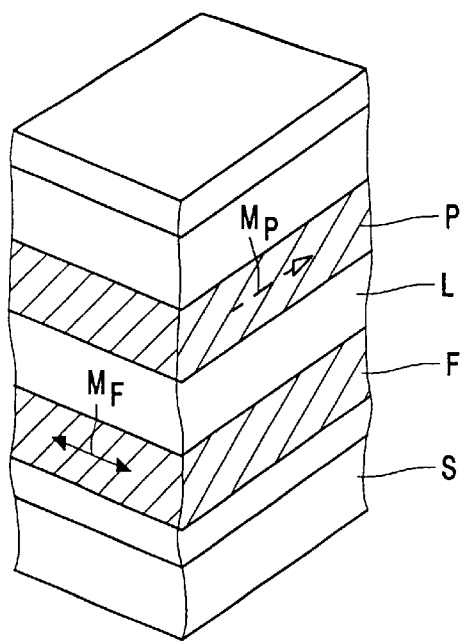
FIG. 5 shows a simplified view of a part of a magnetoresistive sensor device.
Figure 5:
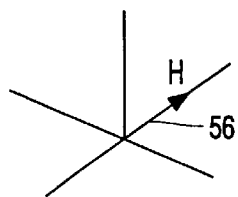

For example, a bridge structure as shown in FIG. 3 can be realized as follows. First a GMR film is deposited on a substrate while a magnetic field is applied in the downward direction (at least during deposition of the pinned layer, for the free layer the field may be rotated over 90° to reduce hysteris). Using lithographic techniques elements (31) and (34) are defined and fabricated out of this film. After that, a GMR film is deposited for the second time, but now the field is applied in the upward direction. This film is patterned into the elements (32) and (33). Finally contact leads can be added in a third lithographic step. In this method it is preferred that the GMR films of both depositions have the same magnetoresistive properties. FIG. 4 shows the equivalent diagram of a Wheatstone bridge, having magnetoresistive sensor devices (41, 42, 43, 44) in accordance with the invention, and a current source 1 for a current $I_{in}$ connected to the terminals 46 and 47. The output voltage V1–V2 is present across the terminals 48 and 49. The bridge can be operated by voltage control or current control. In comparison with voltage control, the current control shown here offers the advantage that a decrease of the output voltage V1–V2 in the event of an increasing temperatures due to a decrease of the relative magnetoresistive effect, is aptly compensated for by an increase of the absolute value of the magnetoresistive elements 41, 42, 43 and 44 in the bridge which is caused by a positive temperature coefficient of the resistive material. FIG. 5 shows the construction of a part of a magnetoresistive sensor device as can be used according to the invention. Arrow $M_F$ in FIG. 5 denotes the direction of the anisotropy axis of free ferromagnetic layer F and an arrow $M_P$ denotes the direction of the magnetization of pinned ferromagnetic layer P. Layers F and P are separated by a non-ferromagnetic layer L. The element is provided on a substrate S. An arrow 56 denotes the component of a magnetic field H to be measured which is directed parallel to the magnetization direction of the second layer P. In the magnetoresistive device 41, 42, 43 and 44 the easy magnetization direction of the sensitive ferromagnetic material of the layer F extends substantially perpendicularly to the magnetization direction of the ferromagnetic layer P. During the manufacture of the sensor devices the magnetization directions of the ferromagnetic layers (F and P) are laid down so that two elements in two adjacent (in the electrical scheme) branches of the bridge exhibit an opposed sensitivity to external magnetic fields. The layers may be deposited by various known method such as by sputter deposition, MBE (Molecular Beam Epitaxy), or ion beam deposition. During deposition a magnetic field is applied which determines the magnetic direction of the layer. Moreover, in each magnetoresistive sensor element the magnetization of a ferromagnetic layer F is adjusted substantially perpendicularly to the magnetization direction of the other ferromagnetic layer P. As a result of these steps it is achieved that auxiliary fields are no longer required for the measurement of small magnetic fields, that the sensor is substantially free of hysteresis and that it has an enhanced linearity.

The free layer may be a single CoFe layer, or a plurality of sublayers (e.g. CoFe+NiFe, CoFe+NiFe+CoFe, etc.) Instead of CoFe, Co or CoNiFe may be used, but if CoNiFe is used, it should preferably not be contiguous with the Cu spacer layer. An AAF may be used and may comprise a plurality of ferromagnetic and non-magnetic layers. Each ferromagnetic pinned layer may be composed as described with respect to the free layer. The device may comprise a combination of two pinned ferromagnetic layers and a free ferromagnetic layer. The device can also be used as a data storage cell. An angle set between the magnetization directions of the free and the pinned layer is representative for e.g. a "0" or a "1". The data content can be read out by measuring the resistance of the memory cell.

Figure 6:
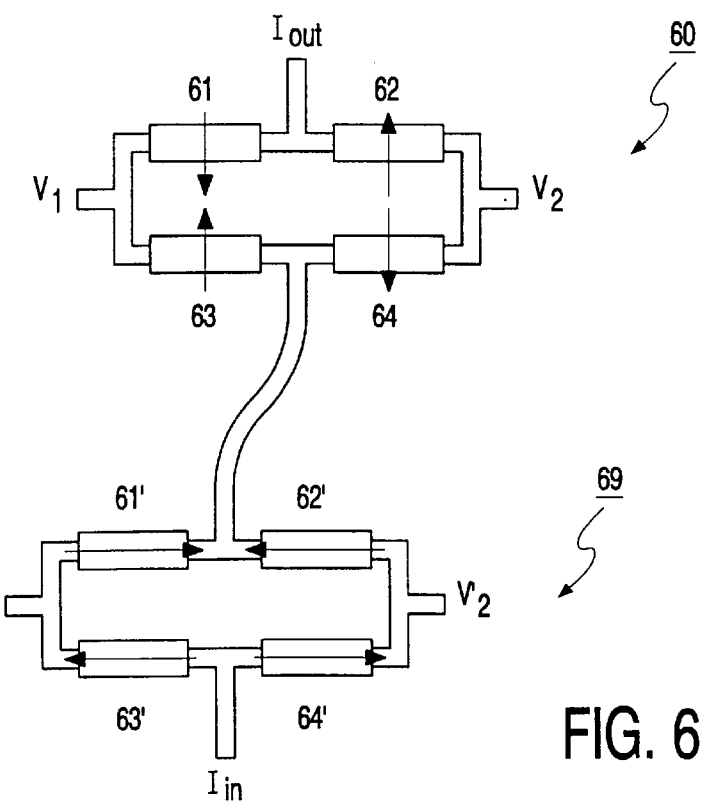
FIG. 6 shows a simplified view of an arrangement comprising two Wheatstone bridge arrangements in which the magnetization direction in corresponding device are under an angle of 90°.

FIG. 6 schematically shows an embodiment in which two Wheatstone bridges 60 and 69 are made. The magnetization directions of the pinned layers 61', 62', 63' and 64' in Wheatstone bridge 69 are oriented under an angle of 90° to the corresponding elements in Wheatstone bridge 60. Such an arrangement can for instance be advantageously used to measure rotating magnetic fields. The signals V1–V2 and V1'–V2' will enable to measure the magnitude as well as the angle (orientation) of the magnetic field to be measured. If the field to be measured has a magnitude so strong that the directions of the magnetization of the free layers follow the direction of the magnetic field to be measured, the signals are a measure of the orientation of the magnetic field independent of the strength of the magnetic field. Using two Wheatstone bridges in which the magnetization directions in corresponding elements form an angle to each other, preferably, but not restricted, to 90° enables to measure the direction of the magnetic field over the full 360° range. In all examples the directions of magnetization or of anisotropic axes are indicated as lying in the plane of the films and being substantially opposite to each other (at least within one Wheatstone bridge arrangement). Although such methods and arrangements are preferred and advantageous, the invention, in its broadest sense, comprises methods in which the magnetization directions are different, which includes at angles different from 180°, for instance 90°. Also the directions need not have to be in the plane of the layers, they may be or have a component transverse to the layers.

The following advantages of systems manufactured according to this aspect of the invention include:

Also applicable for materials with robust exchange-biasing;

Full Wheatstone-bridge configuration are possible;

No integrated conductors for setting the magnetization directions (requiring several extra processing steps) are needed;

The method places no limit on the smallest dimensions in the sensing system;

Elements belonging to different bridge branches can be distributed alternatingly over the system;

Possibility to stack elements on top of each other (with isolation in between), thus reducing the total system area by a factor of 2 and improving the performance of the bridge (due to smaller influences of temperature or field gradients);

Alternatively elements can be positioned at both sides of the substrate on which the system is built.

Figure 7:
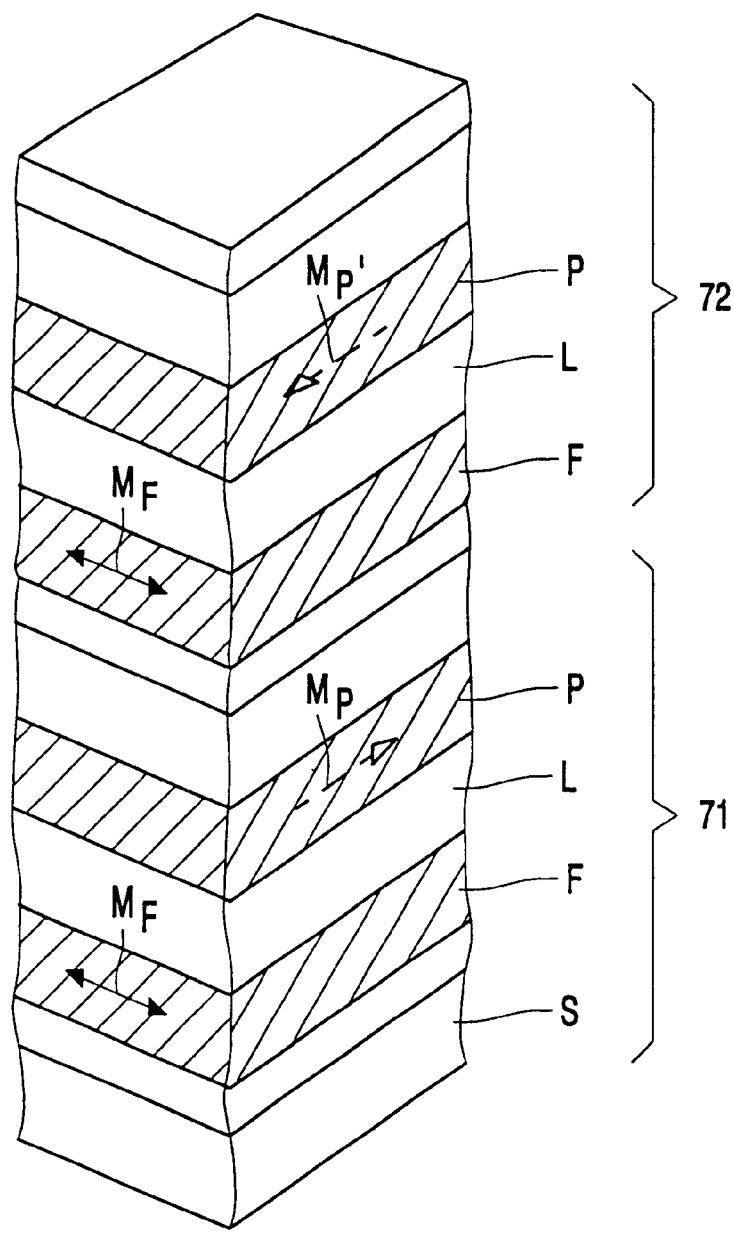
FIG. 7 shows a simplified view of parts of two magnetoresistive devices, stacked on top of each other.
Figure 7:
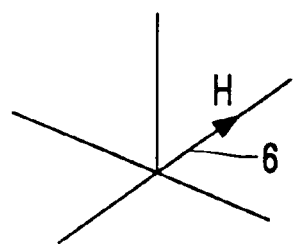

The possibility to stack devices is schematically shown in FIG. 7. The bridge elements 71 and 72 are stacked on top of each other, the magnetization directions MP, MP' of the pinned layers P in elements 71 and 72 are of opposite direction.

Figure 8:
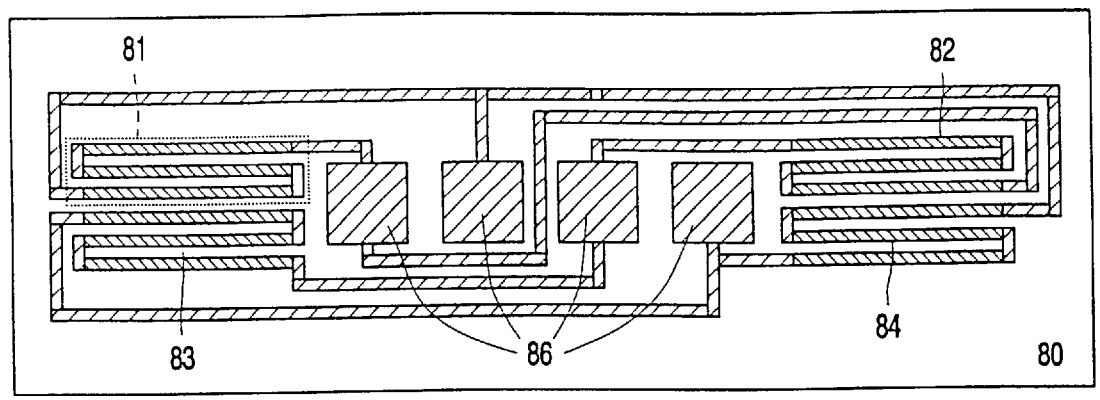
FIG. 8 shows the layout of a sensing system according to an embodiment of the invention with a contact area in between the devices of the system.

FIG. 8 shows the layout of a sensing system according to an embodiment of the invention with a contact area inbetween the devices of the system. FIG. 8 shows a layout of a sensing system with four meander-shaped GMR devices located on opposite sides of the four contact pads (86). One meander strip is forming one element of the Wheatstone bridge. The pads are lined up to provide maximum separation between the two pairs of devices of the Wheatstone bridge while making efficient use of the total area of the substrate (a single chip). The contact pads are typically about 100×100 $\mu$m² with a spacing of 50 $\mu$m. The separation between the devices is therefor about 600 $\mu$m which is about the thickness of a Si wafer (80) which can be used as a substrate. This thickness is relevant since the bias magnets that can be used to create a magnetic field while depositing the device, have to be positioned behind the substrate. Therefor, the substrate thickness sets a minimum length scale over which the direction of a magnetic bias field can be changed. If necessary, the Si wafer can be grinded before deposition to reduce the substrate thickness. The width of a single element meander can be about 75 $\mu$m which is sufficient to structure 7 strips of 5 $\mu$m with 10 $\mu$m period. Combined with a strip length of 300 $\mu$m this should give a bridge resistance of over 4 k$\Omega$ which is sufficiently large. In an alternate embodiment, the separation between the GMR-devices can also be used for flux guide structures or for integrated circuit with signal processing functionality made in the Si substrate.

Figure 9:
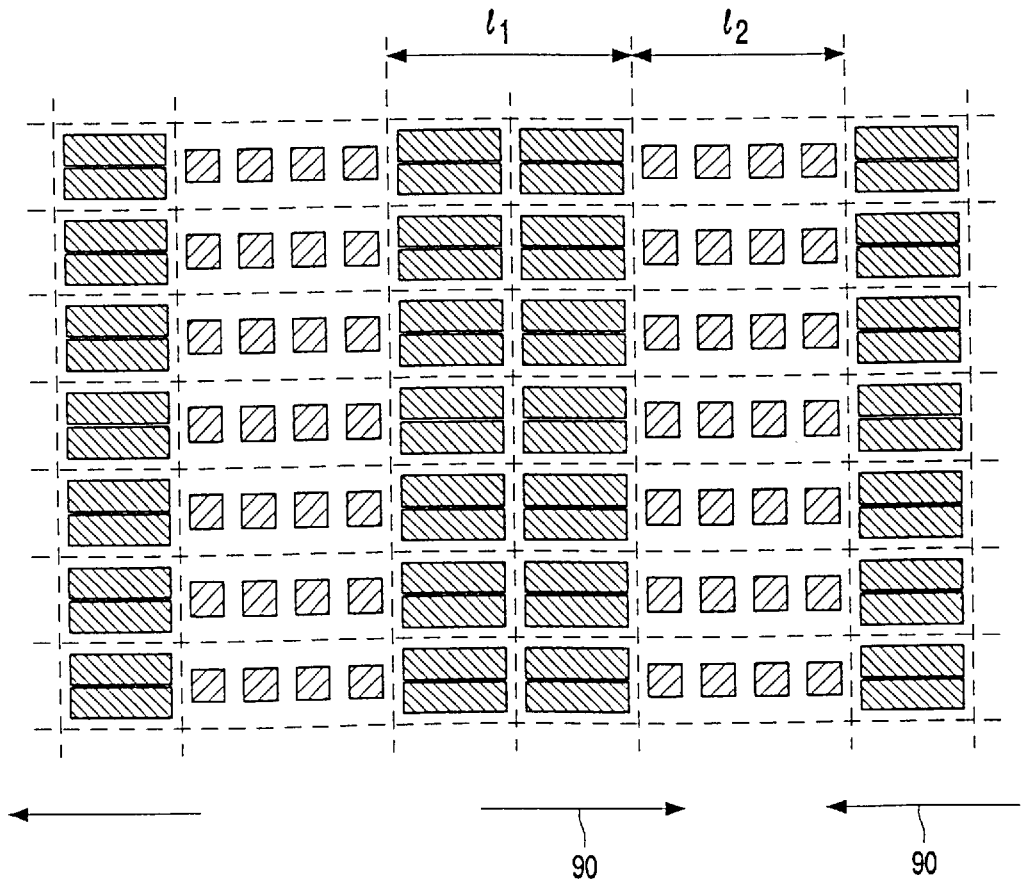
FIG. 9 shows an alternate embodiment of a sensing system according the invention with a contact area inbetween the devices of the system.
Figure 10:
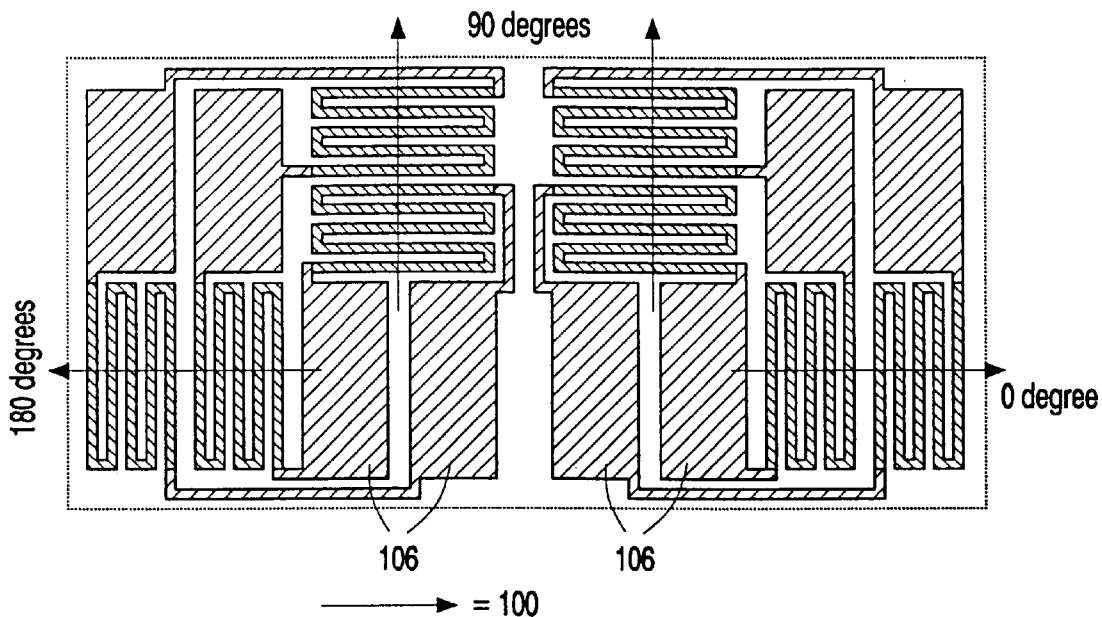
FIG. 10 shows a compact double GMR-based Wheatstone bridge for a full 360 degrees angle sensing system according to another embodiment the invention with four magnetic devices being positioned in a two by two grouped pair-like configuration, with a first pair of devices with substantially the same magnetization direction of the first ferromagnetic layer of the devices under an angle of about 90 degrees with a second pair of devices, the second pair of devices having the first ferromagnetic layer with substantially the same magnetization direction but under an angle of about 90 degrees with respect to the magnetization direction of the first ferromagnetic layer of the first pair of devices.
Figure 11:
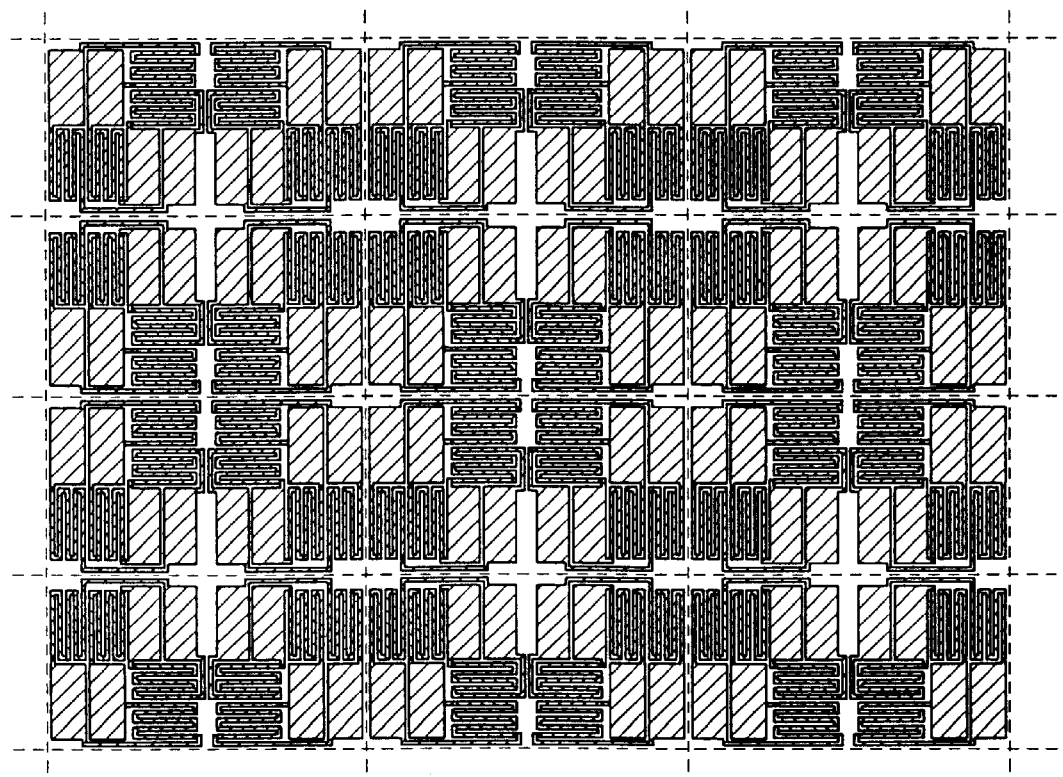
FIG. 11 shows an embodiment with a 3×4 matrix configuration of compact double Wheatstone bridges for a full 360 degrees angle embodiment of the sensing system of the invention.

FIG. 9 schematically shows 14 sensors aligned next to each other on a wafer together with the required magnetic field directions during deposition of the devices. The lengths $l_1$ and $l_2$ define the required length scale over which the magnetic field has to change direction.

The local field direction during deposition of the device is indicated by the horizontal arrows (90).

Figure 12A:
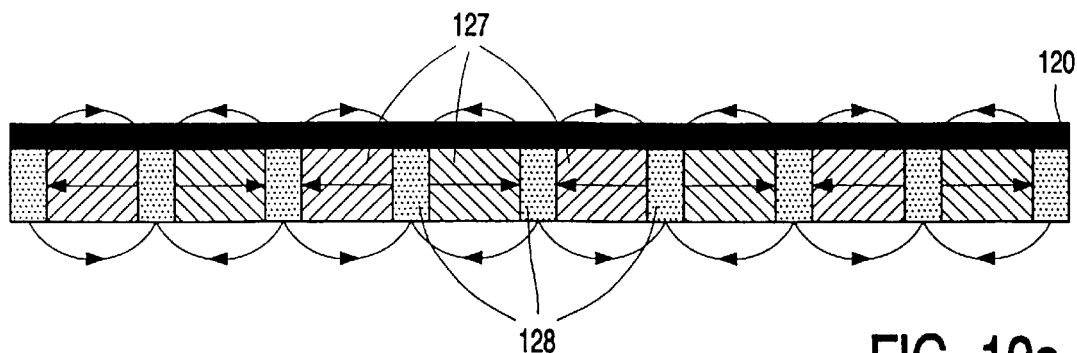
FIGS. 12a and 12b show a deposition holder for a substrate for depositing magnetic devices on said substrate, said holder containing magnetic elements for applying an external magnetic field over at least part of said substrate, said external magnetic field having in said part at least one magnetic characteristic that is position dependent over said substrate. It is shown that the holder contains magnetic elements for applying said external magnetic field.
Figure 12B:
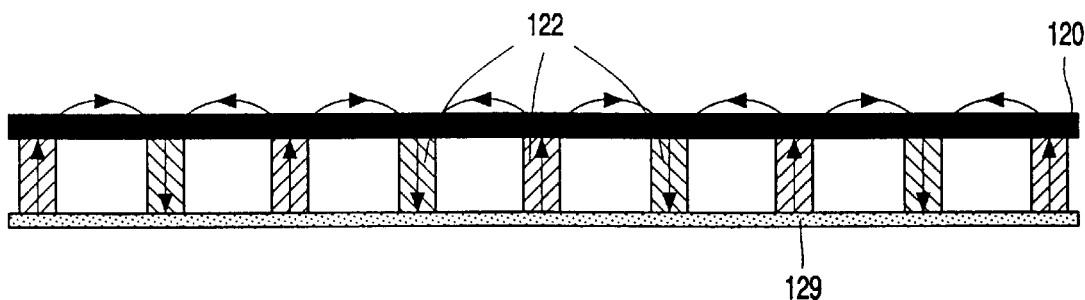

A deposition holder according to the fourth aspect of the invention is shown in FIGS. 12a and 12b which show a side view of a deposition holder for a substrate (120) for depositing magnetic devices on said substrate. The holder contains magnetic elements for applying an external magnetic field that has at least one magnetic characteristic that is position dependent over said substrate (120). The magnetic elements are permanent magnets or electromagnets (127) that in FIG. 12a are alternated with soft magnetic flux guide pieces (128). In FIG. 12b, a soft magnetic backing plate (129) is provided on the deposition holder. The flux lines of the external magnetic field that is generated by the permanent magnets or electromagnets (127) are shown by the curved lines. The deposition holders give rise to an alternating magnetic field at the top side of the substrate (120). Both deposition holders basically give the same magnetic field pattern. The magnetic field at maximum strength is of order of 16 kA/m or higher.

Figure 13:
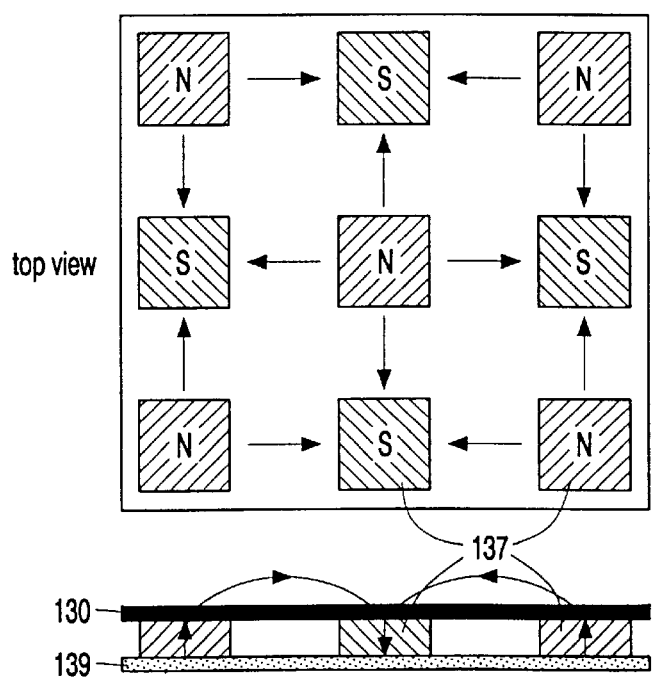
FIG. 13 shows a top-view and a side-view of a deposition holder for a substrate for depositing magnetic devices on said substrate. The deposition holder is suited for depositing a double GMR Wheatstone bridge.

FIG. 13 shows a top-view and a side-view of a deposition holder of a substrate (130) for depositing magnetic devices on said substrate (130). The deposition holder is suited for depositing a double GMR Wheatstone bridge. The holder contains magnetic elements for applying an external magnetic field that has at least one magnetic characteristic that is position dependent over said substrate. The magnetic elements are permanent magnets or electromagnets (137) and has a soft magnetic backing plate (139) is provided on the deposition holder. The flux lines of the external magnetic field that is generated by the permanent magnets or electromagnets (127) is shown by the curved lines in the side view and by the straight lines in the top view figure.

What is claimed is:

1. A sensing system of a magnetic characteristic, said system including a set of magnetic devices in a balancing configuration and essentially each of said devices comprising a structure of layers including at least a first ferromagnetic layer and a second ferromagnetic layer with at least a separation layer of a non-magnetic material therebetween, said structure having at least a magneto resistance effect, and wherein the magnetization direction of the first ferromagnetic layer of at least one of said devices is irreversible in an external magnetic field with a value that is higher than about 35 kA/m.

2. The sensing system as recited in claim 1 wherein the magnetization direction of the first ferromagnetic layer of at least one of said devices is irreversible at room temperature.

3. The sensing system as recited in claim 1 wherein at least one of said devices is irreversible in an external magnetic field with a value in a range of about 40 kA/m to about 200 MA/m, preferably in a range of 40 kA/m to about 2 MA/m.

4. The sensing system as recited in claim 1 wherein at least one of said devices includes an AAF-structure.

5. The sensing system as recited in claim 4 wherein said first ferromagnetic layer comprises an AAF-structure, and an exchange biasing layer, preferably made of IrMn, FeMn, NiMn, PtMn or NiO type material, said exchange biasing layer being adjacent to, and in contact with, the AAF-structure.

6. The sensing system as recited in claim 1 having at least two magnetic devices being positioned in a grouped configuration with a contact area between the groups and with the magnetization direction of the first ferromagnetic layer being substantially opposite for the devices of the different groups and being substantially identical for the devices of the same group.

7. The sensing system as recited in claim 1 having at least two magnetic devices being positioned in a grouped configuration with a first group of devices with substantially the same magnetization direction of the first ferromagnetic layer of the devices under an angle of about 90 degrees with a second group of devices, the second group of devices having the first ferromagnetic layer with substantially the same magnetization direction but under an angle of about 90 degrees with respect to the magnetization direction of the first ferromagnetic layer of the first group of devices.

8. A data storage system comprising at least one magnetic device in a cell configuration and said device comprising a structure of layers including at least a first ferromagnetic layer and a second ferromagnetic layer with at least a separation layer of a non-magnetic material therebetween, said structure having at least a magneto resistance effect, and wherein the magnetization direction of the first ferromagnetic layer of at least one of said devices is irreversible in an external magnetic field higher than about 35 kA/m.

9. A method of operating a magnetic system, said system including a set of magnetic devices and essentially each of said devices comprising a structure of layers including at least a first ferromagnetic layer and a second ferromagnetic layer with at least a separation layer of a non-magnetic material therebetween, said structure having at least a magneto resistance effect, the method comprising the step of alternating at least one of the magnetic characteristics of at least one of the devices of said set by heating part of said system comprising said at least one device of said set while applying an external magnetic field over at least part of said system, the part including said at least one device.

10. A method of resetting or repairing or changing a magnetic system, said system including a set of magnetic devices and essentially each of said devices comprising a structure of layers including at least a first ferromagnetic layer and a second ferromagnetic layer with at least a separation layer of a non-magnetic material therebetween, said structure having at least a magneto resistance effect, the method comprising the step of alternating at least one of the magnetic characteristics of at least one of the devices of said set by heating part of the system including said at least one device of said set while applying an external magnetic field over at least part of said system, the part including said at least one device.

* * * * *